(12) United States Patent
Yu et al.

(10) Patent No.: US 11,930,626 B2
(45) Date of Patent: Mar. 12, 2024

(54) INVERTER AND HEAT RADIATION STRUCTURE THEREOF

(71) Applicant: Sungrow Power Supply Co., Ltd., Hefei (CN)

(72) Inventors: Renbin Yu, Anhui (CN); Jie Zhou, Anhui (CN); Peng Chen, Anhui (CN); Wenhao Li, Anhui (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 200 days.

(21) Appl. No.: 17/396,498

(22) Filed: Aug. 6, 2021

(65) Prior Publication Data

US 2022/0159880 A1 May 19, 2022

(30) Foreign Application Priority Data

Nov. 13, 2020 (CN) .......................... 202022638440.3

(51) Int. Cl.
*H05K 7/20* (2006.01)

(52) U.S. Cl.
CPC ....... *H05K 7/20918* (2013.01); *H05K 7/2039* (2013.01)

(58) Field of Classification Search
CPC ............. H05K 7/20918; H05K 7/2039; H05K 7/20145; H05K 7/20909; H05K 7/20172;

(Continued)

(56) References Cited

U.S. PATENT DOCUMENTS 6,404,049 B1 * 6/2002 Shibamoto .......... H01L 23/4985
257/E23.106
2001/0030039 A1 * 10/2001 Copeland ................ F28F 3/048
165/185

(Continued)

FOREIGN PATENT DOCUMENTS

CN 201548015 U 8/2010
EP 3 001 786 B1 8/2018
JP 2000-126874 A 5/2000

OTHER PUBLICATIONS

Extended European Search Report for European Application No. 21207847.1, dated Apr. 13, 2022.

(Continued)

*Primary Examiner* — Mandeep S Buttar
(74) *Attorney, Agent, or Firm* — Wolf, Greenfield & Sacks, P.C.

(57) ABSTRACT

An inverter and a heat radiation structure thereof are provided. The heat radiation structure of the inverter includes a heat radiator for radiating heat from a heating element of the inverter, and a heat radiation fan for air-cooling the heat radiator. The heat radiator includes multiple heat radiation fins able to be air-cooled. The number of the heat radiator is at least two, and two adjacent heat radiators are a first heat radiator and a second heat radiator respectively. The heat radiation fan is provided between the first heat radiator and the second heat radiator, and the heat radiation fan is located on the tops of the heat radiation fins. In the heat radiation structure of the inverter, the heat radiation fan is capable of cooling the first heat radiator and the second heat radiator at the same time.

18 Claims, 5 Drawing Sheets

(58) Field of Classification Search
CPC .. H05K 7/209; H05K 7/1432; H05K 7/14322; H05K 7/20136; H05K 7/20409; H01L 23/467
See application file for complete search history.

(56) References Cited

U.S. PATENT DOCUMENTS

| | | | | |
|---|---|---|---|---|
| 2004/0069479 | A1* | 4/2004 | Yeh | H01L 23/3672 165/185 |
| 2007/0159796 | A1* | 7/2007 | Artman | H01L 23/467 257/E23.099 |
| 2014/0063739 | A1* | 3/2014 | Liu | H05K 7/20909 361/695 |
| 2014/0110834 | A1* | 4/2014 | Kusaka | H05K 7/20918 257/722 |
| 2016/0091264 | A1* | 3/2016 | Lu | H02S 40/42 165/121 |
| 2017/0277027 | A1* | 9/2017 | Fukuda | F28D 15/0275 |
| 2017/0339806 | A1* | 11/2017 | Guentert | H05K 7/209 |
| 2019/0380223 | A1* | 12/2019 | Hayashi | H05K 7/14322 |

OTHER PUBLICATIONS

Office Action for Indian Application No. 202144051793, dated May 31, 2022.

* cited by examiner

INVERTER AND HEAT RADIATION STRUCTURE THEREOF

The present disclosure claims the priority to Chinese patent application No. 202022638440.3 titled "INVERTER AND HEAT RADIATION STRUCTURE THEREOF", filed with the China National Intellectual Property Administration on Nov. 13, 2020, which is incorporated herein by reference in its entirety.

FIELD

The present disclosure relates to the technical field of heat radiation of inverters, in particular to an inverter and a heat radiation structure of the inverter.

BACKGROUND

An inverter is a converter for converting DC power into AC power with constant frequency and constant voltage or frequency and voltage regulation, which is an important device in photovoltaic power generation systems and other power systems.

The inverter includes a heating element, which needs to be cooled to ensure the normal operation of the inverter. A heat radiation structure of the inverter is diverse. For example, a heat radiator is used to radiate heat from the heating element of the inverter, and a heat radiation fan is used to air-cool the heat radiator. The heat radiator includes a heat radiation substrate and a heat radiation fin provided on the heat radiation substrate. At present, each heat radiation fan is only capable of cooling one heat radiator, that is, each heat radiation fan is only capable of cooling the heating element on the same heat radiator, which causes the utilization rate of the heat radiation fan is low; in addition, when there are more heat radiators, more heat radiation fans are further required, which causes a higher heat radiation cost.

In summary, those skilled in the art have a strong desire is to design a heat radiation structure of the inverter to improve the utilization rate of the heat radiation fan and reduce the heat radiation cost.

SUMMARY

In view of this, a purpose of the present disclosure is to provide a heat radiation structure of an inverter, so as to improve the utilization rate of a heat radiation fan and reduce heat radiation cost. Another purpose of the present disclosure is to provide an inverter with the above heat radiation structure.

In order to achieve the purposes, the following technical solutions are provided according to the present disclosure.

A heat radiation structure of an inverter is provided according to the present disclosure, including: a heat radiator for radiating heat from a heating element of the inverter, and a heat radiation fan for air-cooling the heat radiator;

where the heat radiator includes multiple heat radiation fins able to be air-cooled;

where the number of the heat radiator is at least two, and two adjacent heat radiators are a first heat radiator and a second heat radiator respectively; and where the heat radiation fan is provided between the first heat radiator and the second heat radiator, and the heat radiation fan is located on tops of the plurality of heat radiation fins.

Preferably, the heat radiator includes a heat radiation substrate, and the heat radiation fins are provided on the heat radiation substrate; and where an angle between an air outlet direction of the heat radiation fan and a normal direction of the heat radiation substrate is less than 90 degrees.

Preferably, the heat radiation fins are located on an air outlet side of the heat radiation fan.

Preferably, the heat radiation fan is embedded on the heat radiation fins.

Preferably, the heat radiation fan is located on one side of the heat radiation substrate, and the heating element is located on the other side of a same position of the heat radiation substrate.

Preferably, the heat radiation structure further includes a wind deflector, the wind deflector is located on the air outlet side of the heat radiation fan to guide outlet air from the heat radiation fan to flow toward the heat radiation fins of the first heat radiator and the heat radiation fins of the second heat radiator.

Preferably, the first heat radiator and the second heat radiator share a same heat radiation substrate, and the heat radiation substrate is the wind deflector.

Preferably, the heat radiation fan is an axial flow fan.

Preferably, the heat radiation fan is embedded on the heat radiation fins.

Preferably, the heat radiation fan is located on one side of the heat radiation substrate, and the heating element is located on the other side of a same position of the heat radiation substrate.

Preferably, the heat radiator includes a heat radiation substrate; where the heat radiation fins are provided on the heat radiation substrate, and an angle between the heat radiation fins and the heat radiation substrate is less than 90 degrees.

Preferably, the heat radiator includes a heat radiation substrate; where the heat radiation fins are provided on the heat radiation substrate, an angle between the heat radiation fins and the heat radiation substrate equals to 90 degrees.

Preferably, the heat radiation fins are sheet-shaped or needle-shaped.

Preferably, the heat radiation fins are linear or arc-shaped.

Preferably, the number of the heat radiation fan is at least two, and the at least two heat radiation fans are sequentially distributed along a distribution direction of the heat radiation fins.

Based on the above heat radiation structure of the inverter, the inverter is further provided by the present disclosure, including a heat radiation structure, where the heat radiation structure is the heat radiation structure according to any one above.

Preferably, the heat radiation structure is located outside a housing of the inverter, and the heating element is located inside the housing.

In the heat radiation structure of the inverter according to the present disclosure, there are at least two heat radiators, and the two adjacent heat radiators are a first heat radiator and a second heat radiator respectively; where the heat radiation fan is provided between the first heat radiator and the second heat radiator, and the heat radiation fan is located on the top of the heat radiation fins, such that the heat radiation fan is capable of cooling the first heat radiator and the second heat radiator at the same time. That is, the heat radiation fan is capable of cooling the heating elements 6 on different heat radiators at the same time, which improves the utilization rate of the heat radiation fan; at the same time, the number of required heat radiation fans may be reduced, so as to reduce the eat radiation cost.

BRIEF DESCRIPTION OF THE DRAWINGS

For more clearly illustrating embodiments of the present disclosure or the technical solutions in the conventional technology, drawings referred to for describing the embodiments or the conventional technology will be briefly described hereinafter. Apparently, drawings in the following description are only examples of the present disclosure, and for the person skilled in the art, other drawings may be obtained based on the set drawings without any creative efforts.

DETAILED DESCRIPTION OF THE EMBODIMENTS

The technical solutions according to the embodiments of the present disclosure will be described clearly and completely as follows in conjunction with the drawings in the embodiments of the present disclosure. It is apparent that the described embodiments are only a part of the embodiments according to the present disclosure, rather than all of the embodiments. Based on the embodiments of the present disclosure, all other embodiments obtained without creative efforts by those of ordinary skill in the art shall fall within the protection scope of the present disclosure.

Figure 1:
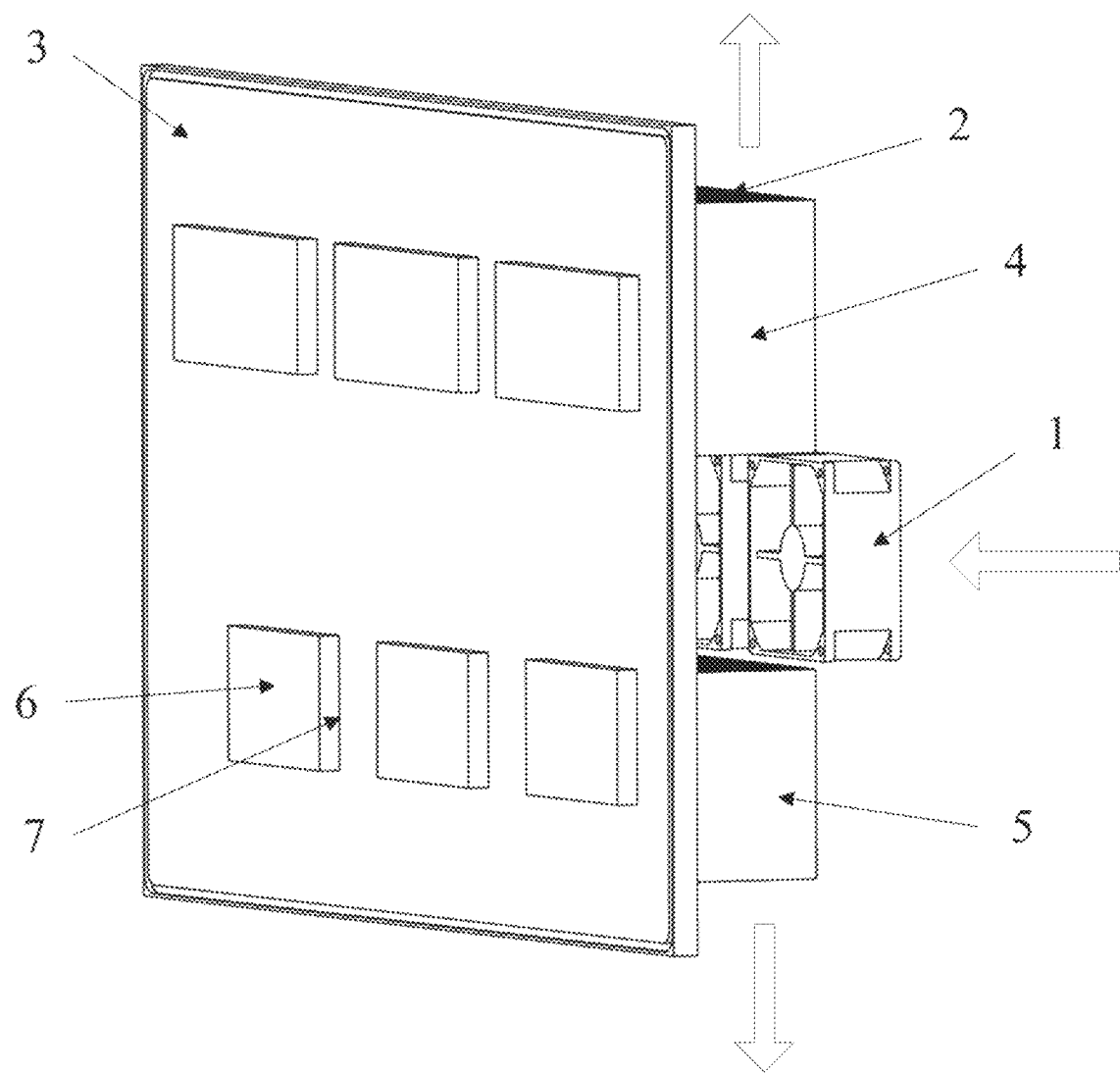
FIG. 1 is a structural schematic diagram of a heat radiation structure of an inverter according to an embodiment of the present disclosure.
Figure 2:
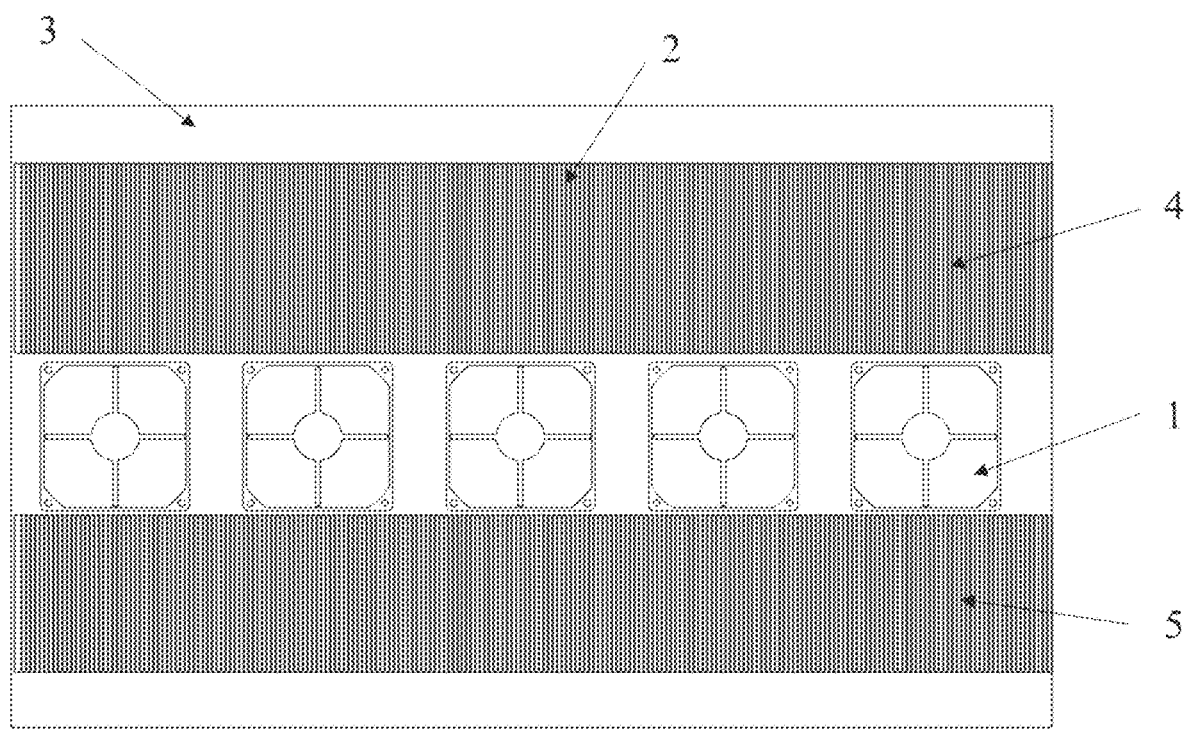
FIG. 2 is a side view of the structure shown in FIG. 1.
Figure 3:
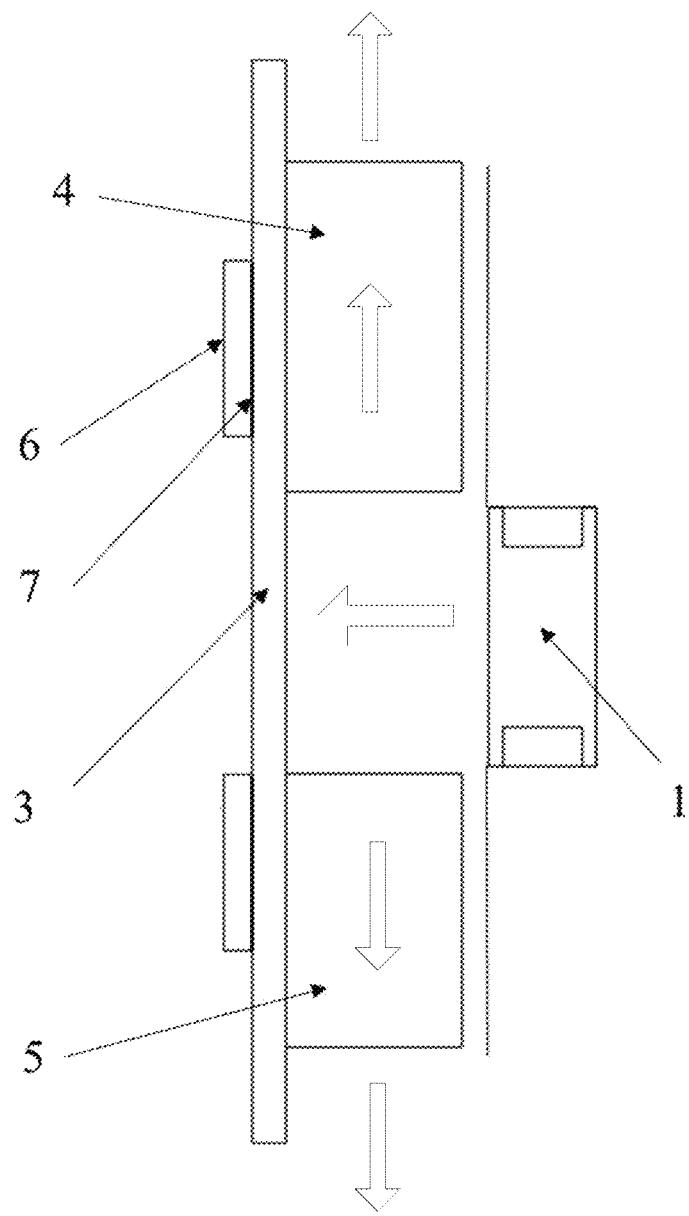
FIG. 3 is a front view of the structure shown in FIG. 1.

As shown in FIGS. 1 to 5, a heat radiation structure of an inverter according to an embodiment of the present disclosure includes: a heat radiator for radiating heat from a heating element 6 of the inverter, and a heat radiation fan 1 for air-cooling the heat radiator; and where the heat radiator includes multiple heat radiation fins that can be air-cooled;

in the above heat radiation structure of the inverter, there are at least two heat radiators, and the two adjacent heat radiators are a first heat radiator and a second heat radiator respectively; where the heat radiation fan is provided between the first heat radiator and the second heat radiator, and the heat radiation fan is located on the tops of the heat radiation fins, as shown in FIGS. 1 to 3. It can be understood that there is a gap between the first heat radiator 4 and the second heat radiator 5 to ensure the installation of the heat radiation fan 1. The top of each heat radiation fin 2 is a free end of the heat radiation fin 2.

In the above heat radiation structure of the inverter, the heat radiation fan 1 is provided between the first heat radiator 4 and the second heat radiator 5, and the heat radiation fan 1 is located on the tops of the heat radiation fins 2, such that the heat radiation fan 1 is capable of cooling the first heat radiator 4 and the second heat radiator 5 at the same time. That is, the heat radiation fan 1 is capable of cooling the heating elements 6 on different heat radiators at the same time, which improves the utilization rate of the heat radiation fan 1; at the same time, the number of required heat radiation fans 1 may be reduced, so as to reduce the heat radiation cost.

The above heat radiation fan 1 may be arranged between two adjacent heat radiators according to structural requirements. Therefore, a distance between the first heat radiator 4 and the second heat radiator 5 may be arbitrarily adjusted according to internal layout requirements.

In the above heat radiation structure of the inverter, by changing structural dimensions, such as an installation angle and position of the heat radiation fan 1, a height of the heat radiation fins 2 of the first heat radiator 4 and the second heat radiator 5, a length of the heat radiation fins 2 of the first heat radiator 4 and the second heat radiator 5 and a tooth spacing of the heat radiation fins 2 of the first heat radiator 4 and the second heat radiator 5, an air volume entering the first heat radiator 4 and the second heat radiator 5 may be adjusted to achieve heat radiation requirements of different heating elements 6.

In the above heat radiation structure of the inverter, a specific structure of the heat radiator may be selected according to actual needs. In order to facilitate heat radiation and installation, the above heat radiator includes a heat radiation substrate 3, and heat radiation fins 2 are provided on the heat radiation substrate 3. Specifically, the heat radiation fins 2 are located on a side of the heat radiation substrate 3, and the heating element 6 of the inverter is located on the other side of the heat radiation substrate 3. In this case, the tops of the heat radiation fins 2 are ends of the heat radiation fins 2, which are away from the heat radiation substrate 3.

In order to improve the heat radiation efficiency, an angle between an air outlet direction of the heat radiation fan 1 and a normal direction of the heat radiation substrate 3 is less than 90 degrees. Specifically; the angle between the air outlet direction of the heat radiation fan 1 and the normal direction of the heat radiation substrate 3 is zero degree; that is, the air outlet direction of the heat radiation fan 1 is parallel to the normal direction of the heat radiation substrate 3; or, the angle between the air outlet direction of the heat radiation fan 1 and the normal direction of the heat radiation substrate 3 is greater than zero degree and less than 90 degrees.

The angle between the air outlet direction of the heat radiation fan 1 and the normal direction of the heat radiation substrate 3 may be adjusted by adjusting an installation angle of the heat radiation fan 1, which is not limited in the embodiment.

In the above heat radiation structure of the inverter, the heat radiation fins 2 may be located on an air outlet side of the heat radiation fan 1 or may be located on an air inlet side of the heat radiation fan 1. In order to facilitate installation and simplify the structure, preferably, the above heat radiation fins 2 are located on the air outlet side of the heat radiation fan 1.

In order to ensure air cooling of the heat radiation fins 2 of the heat radiator, as shown in FIGS. 1 to 3, the above heat radiation structure of an inverter further includes a wind deflector, and the wind deflector is located on the air outlet side of the heat radiation fan 1, so that outlet air of the heat radiation fan 1 flows to the heat radiation fins 2 of the first heat radiator 4 and the second heat radiator 5.

In the above structure, wind discharged from the heat radiation fan 1 is blocked by the wind deflector and enters a gap between the heat radiation fins 2 of the first heat radiator 4 and a gap between the heat radiation fins 2 of the second heat radiator 5. In this way, air cooling of the heat radiation fins 2 is realized.

The two adjacent heat radiators may share the same heat radiation substrate or may independently adopt different heat radiation substrates. That is, multiple heating elements 6 may be installed on one heat radiator or on multiple heat radiators. In order to reduce the number of parts, the first heat radiator 4 and the second heat radiator 5 share the same heat radiation substrate 3. Further, the heat radiation substrate 3 is a wind deflector. It can be understood that a part of the heat radiation substrate 3 is a wind deflector.

In the above structure, the wind blown by the heat radiation fan 1 is dispersed to both sides after hitting the heat radiation substrate 3, and flows through the heat radiation fins 2 on the first heat radiator 4 and the second heat radiator 5 at the same time. That is, the heat radiation fan 1 is capable of cooling the heating elements 6 on the first heat radiator 4 and the second heat radiator 5 at the same time. An air outlet direction of the entire heat radiation structure is that air is discharged from the top and the bottom as shown in FIGS. 1 and 3, since interference between two adjacent heat radiation fans 1 is small, so an air outlet resistance of the heat radiation fan 1 is small, which is more beneficial for heat radiation, and the heat radiation efficiency is improved.

In the heat radiation structure of the inverter, the type of the heat radiation fan 1 is selected according to actual needs. In order to shorten an air duct, preferably, the heat radiation fan 1 is an axial flow fan. Of course, the heat radiation fan 1 may also be selected as a mixed flow fan, which is not limited in the embodiment.

In order to facilitate installation, the heat radiation fan 1 is embedded on the heat radiation fins 2. Of course, the heat radiation fan 1 may also be installed on other components, which is not limited in the embodiment.

Preferably, the heat radiation fan 1 is located on one side of the heat radiation substrate 3, and the heating element 6 is located on the other side of the same position of the heat radiation substrate 3. It can be understood that the projections of the heat radiation fan 1 and the heating element 6 on the heat radiation substrate 3 have overlapping portions. In this way, the wind blown by the heat radiation fan 1 flows through the heat radiation fins 2, and continues to impact a junction part of the hear radiation substrate 3 and the heating element 6. That is, the cold wind directly impacts the highest temperature point, thereby further shortening the length of the air duct and improving the heat radiation efficiency.

Of course, other distribution methods may also be selected, which are not limited in the embodiment.

A specific structure of the heat radiator may be selected according to actual needs. Preferably, the heat radiator includes a heat radiation substrate 3, and the heat radiation fins 2 are arranged on the heat radiation substrate 3; where an angle between the heat radiation fins 2 and the heat radiation substrate 3 is less than 90 degrees, or the angle between the heat radiation fins 2 and the heat radiation substrate 3 equals to 90 degrees.

In order to increase the heat radiation area, preferably, the angle between the heat radiation fins 2 and the heat radiation substrate 3 is less than 90 degrees; in order to facilitate production, preferably, the angle between the heat radiation fins 2 and the heat radiation substrate 3 equals to 90 degrees.

The shape of the heat radiation fins 2 is further selected according to actual needs, such as sheet shape, needle shape, block shape, and etc. In order to increase the number of heat radiation fins 2 to increase the heat radiation area, preferably, the heat radiation fins 2 are sheet-shaped or needle-shaped. Preferably, the heat radiation fins 2 are needle-shaped, so that cold air hitting the heat radiation fins 2 may flow around, which improves the heat radiation effect.

In a case that the heat radiation fins 2 are sheet-shaped, in order to improve the heat radiation efficiency, preferably, a distribution direction of the heat radiation fan 1 is perpendicular to a longitudinal direction of the heat radiation fins 2.

In the heat radiator, the heat radiation fins 2 may be linear or curvilinear. In order to increase the heat radiation area without changing the height of the heat radiation fins 2, preferably, the heat radiation fins 2 have a curvilinear shape.

Figure 4:
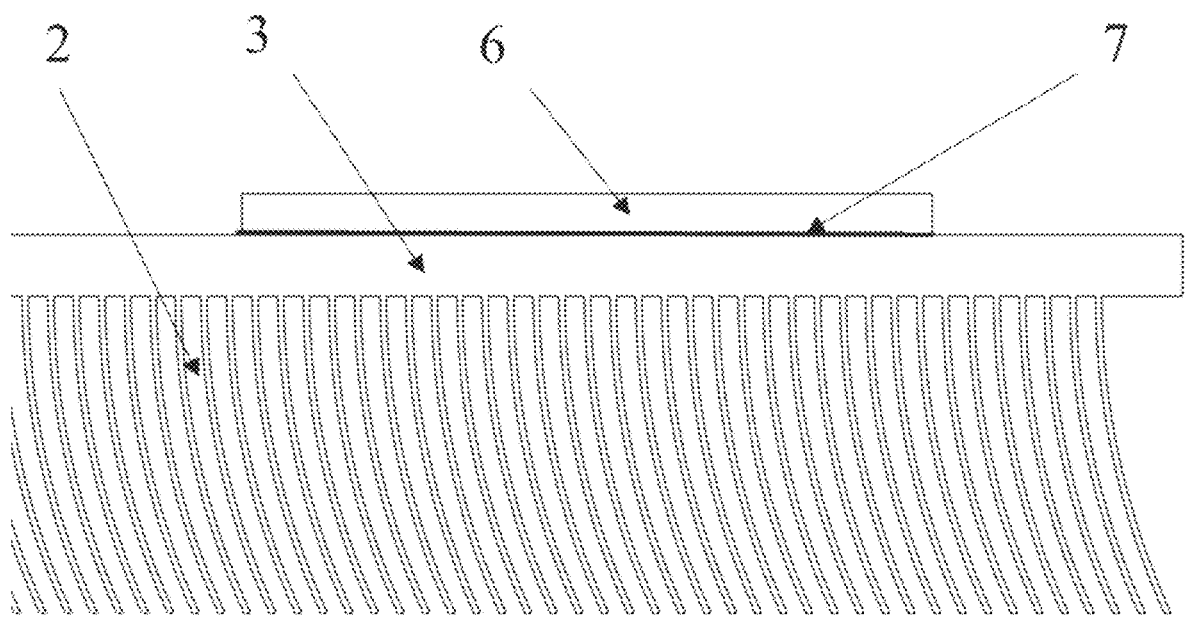
FIG. 4 is a structural schematic diagram of a heat radiator in a heat radiation structure of an inverter according to an embodiment of the present disclosure.

The specific type of the curvilinear shape may be selected according to actual needs. For example, the heat radiation fins 2 are arc-shaped as shown in FIG. 4.

It should be noted that in a case that the heat radiation fin 2 has a curvilinear shape, an angle between the heat radiation fins 2 and the heat radiation substrate 3 is the maximum angle between the heat radiation fins 2 and the heat radiation substrate 3.

In order to improve the heat radiation effect, there are at least two heat radiation fans 1 and the heat radiation fans 1 are sequentially distributed along a distribution direction of the heat radiation fins 2. Specifically, as shown in FIG. 2, the heat radiation fins 2 are distributed in order from left to right, and the heat radiation fans 1 are further distributed in order from left to right.

In the above heat radiation structure of an inverter, the wind discharged by the heat radiation fan 1 passes through the heat radiation fins 2, so that the heat radiation fins 2 are cooled by the wind. Since there are at least two heat radiation fans 1 and the heat radiation fans 1 are sequentially distributed along a distribution direction of the heat radiation fins 2, there must be heat radiation fins 2 spaced between two adjacent heat radiation fans 1, and the heat radiation fins 2 spaced between the two adjacent heat radiation fans 1 is capable of reducing air volume that flows between the two adjacent heat radiation fans 1, which effectively reduces a mutual interference between the two adjacent heat radiation fans 1 and reduces the air flow resistance, thereby improving the heat radiation effect.

Moreover, in the above heat radiation structure of the inverter, airflow flows to both ends of a gap between two adjacent heat radiation fins 2, which facilitates air cooling of at least two heat radiators, thereby realizing cooling of heating elements on at least two heat radiators.

Figure 5:
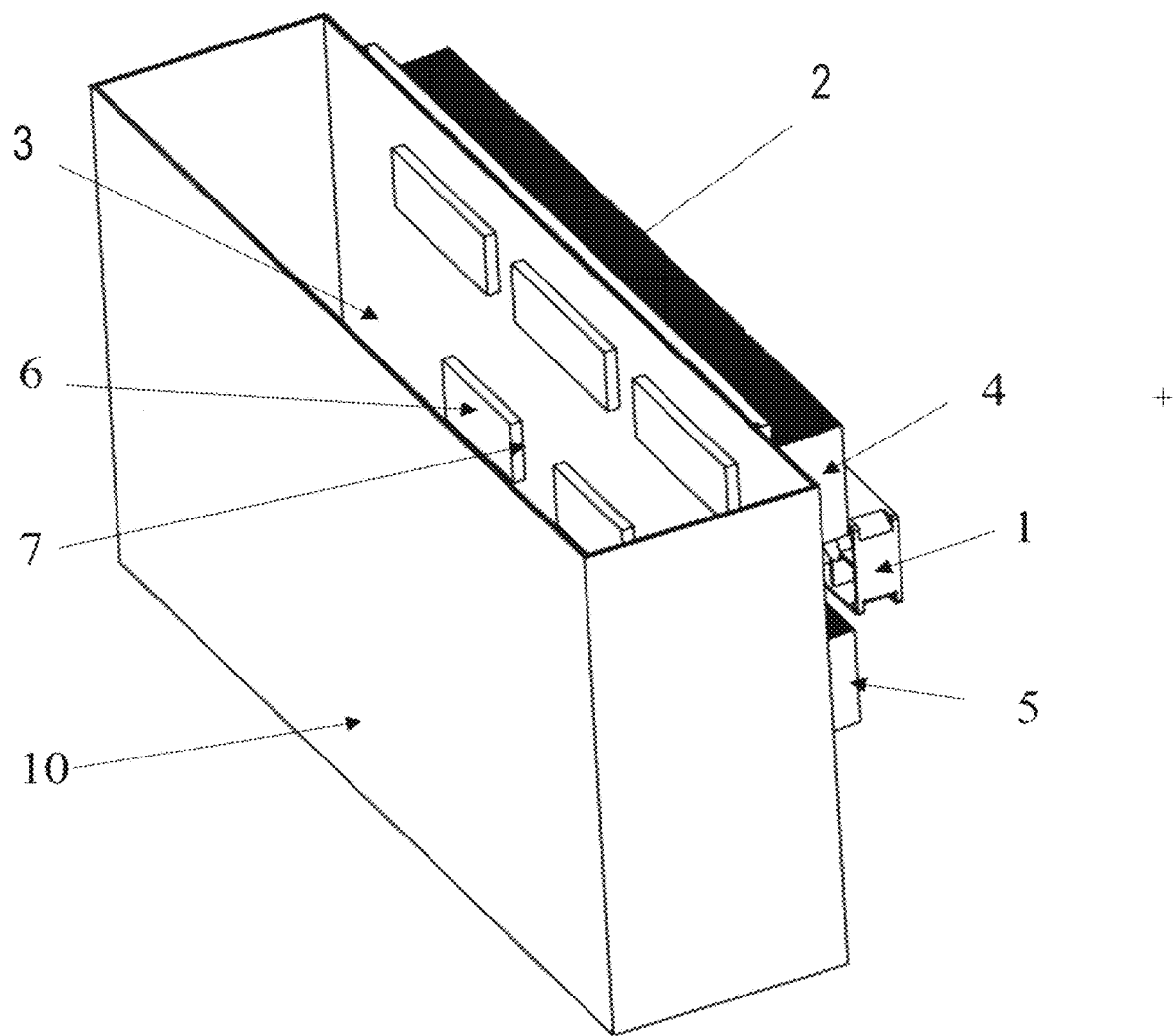
FIG. 5 is a structural schematic diagram of an inverter according to an embodiment of the present disclosure.

Based on the heat radiation structure of the inverter provided in the above embodiments, an inverter is further provided according to the embodiment. As shown in FIG. 5, the inverter includes a heat radiation structure, and the heat radiation structure is the heat radiation structure of the inverter, which is described in above embodiments.

Since the heat radiation structure of the inverter according to the above embodiments has the above technical effects, the inverter according to the above embodiments includes the heat radiation structure of the inverter according to the above embodiments, so that the inverter according to the above embodiments also has corresponding technical effects, which is not repeated herein.

In the above inverter, there are two heat radiators, which are the first heat radiator 4 and the second heat radiator 5. The first heat radiator 4 and the second heat radiator 5 share the same heat radiation substrate 3. The heating element 6 of the inverter is located on a side of the heat radiation substrate 3, and the heat radiation fins 2 are located on the other side of the heat radiation substrate 3. The heating element 6 is fastened to the heat radiation substrate 3 through an interface material 7. That is, the heating element 6 transfers heat to the heat radiation substrate 3 through the interface material 7, the heat radiation substrate 3 transfers heat to the heat radiation fins 2, and then cold wind blown by the heat radiation fan 1 takes away the heat on the heat radiation fins 2 and the radiating substrate 3 and blow the heat to the outside to achieve the purpose of heat radiation.

A specific type of the interface material 7 may be selected according to actual needs, which is not limited in the embodiment.

In order to simplify the structure and improve the protection performance, preferably, the above heat radiation structure is located outside a closed housing 10 of the inverter, and the heating element 6 is located inside the closed housing 10, as shown in FIG. 5.

It should be noted that an inner cavity of the closed housing 10 of the inverter is not communicated with the outside of the closed housing 10. The heat radiator and the heat radiation fan 1 of the above heat radiation structure are both located outside the closed housing 10, which are communicated with the external environment. In this way, the heat radiation structure can directly use outside air, and the outside air does not need to enter the closed housing 10, which improves the protective performance of the housing 10 and enables the closed housing 10 to be a highly protective housing, thereby improving the protective performance of the entire inverter.

The above illustration of the disclosed embodiments can enable those skilled in the art to implement or use the present disclosure. Various modifications to the embodiments are apparent to the person skilled in the art, and the general principle herein can be implemented in other embodiments without departing from the spirit or scope of the present disclosure. Therefore, the present disclosure is not limited to the embodiments described herein, but should be in accordance with the broadest scope consistent with the principle and novel features disclosed herein.

The invention claimed is:

1. A heat radiation structure of an inverter, comprising:
   a heat radiator for radiating heat from a heating element of the inverter, and
   a heat radiation fan for air-cooling the heat radiator;
   wherein the heat radiator comprises a plurality of heat radiation fins able to be air-cooled;
   wherein a number of the heat radiator is at least two, and two adjacent heat radiators are a first heat radiator and a second heat radiator respectively; and wherein the heat radiation fan is provided between the first heat radiator and the second heat radiator,
   wherein, the heat radiator comprises a heat radiation substrate, and the heat radiation fins are provided on the heat radiation substrate, wherein a plane defined by a base of the heat radiation fan is not closer to the heat radiation substrate than a plane defined by tops of the heat radiation fins to the heat radiation substrate.

2. The heat radiation structure according to claim 1, wherein an angle between an air outlet direction of the heat radiation fan and a normal direction of the heat radiation substrate is less than 90 degrees.

3. The heat radiation structure according to claim 2, wherein the heat radiation fins are located on an air outlet side of the heat radiation fan.

4. The heat radiation structure according to claim 3, wherein the heat radiation structure further comprises a wind deflector, and the wind deflector is located on the air outlet side of the heat radiation fan to guide outlet air from the heat radiation fan to flow toward the heat radiation fins of the first heat radiator and the heat radiation fins of the second heat radiator.

5. The heat radiation structure according to claim 4, wherein the first heat radiator and the second heat radiator share a same heat radiation substrate, and the heat radiation substrate is the wind deflector.

6. The heat radiation structure according to claim 2, wherein the heat radiation fan is an axial flow fan.

7. The heat radiation structure according to claim 1, wherein the heat radiation fan is located on one side of the heat radiation substrate, and the heating element is located on the other side of a same position of the heat radiation substrate.

8. The heat radiation structure according to claim 1, wherein an angle between the heat radiation fins and the heat radiation substrate is less than 90 degrees.

9. The heat radiation structure according to claim 1, wherein an angle between the heat radiation fins and the heat radiation substrate equals to 90 degrees.

10. The heat radiation structure according to claim 1, wherein the heat radiation fins are sheet-shaped or needle-shaped.

11. The heat radiation structure according to claim 1, wherein the heat radiation fins are linear or arc-shaped.

12. The heat radiation structure according to claim 1, wherein a number of the heat radiation fan is at least two, and the at least two heat radiation fans are sequentially distributed along a distribution direction of the heat radiation fins.

13. The heat radiation structure according to claim 2, wherein a number of the heat radiation fan is at least two, and the at least two heat radiation fans are sequentially distributed along a distribution direction of the heat radiation fins.

14. The heat radiation structure according to claim 3, wherein a number of the heat radiation fan is at least two, and the at least two heat radiation fans are sequentially distributed along a distribution direction of the heat radiation fins.

15. An inverter, comprising a heat radiation structure, wherein the heat radiation structure is the heat radiation structure according to claim 1.

16. The inverter according to claim 15, wherein the heat radiation structure is located outside a housing of the inverter, and the heating element is located inside the housing.

17. An inverter, comprising a heat radiation structure, wherein the heat radiation structure is the heat radiation structure according to claim 2.

18. The inverter according to claim 17, wherein the heat radiation structure is located outside a housing of the inverter, and the heating element is located inside the housing.

* * * * *